(12) United States Patent
Akai

(10) Patent No.: US 8,704,308 B2
(45) Date of Patent: Apr. 22, 2014

(54) SEMICONDUCTOR DEVICE

(75) Inventor: Kazumasa Akai, Ota (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/350,332

(22) Filed: Jan. 13, 2012

(65) Prior Publication Data

US 2012/0181611 A1 Jul. 19, 2012

(30) Foreign Application Priority Data

Jan. 14, 2011 (JP) ................................. 2011-005635

(51) Int. Cl.
*H01L 23/62* (2006.01)

(52) U.S. Cl.
USPC ................ 257/358; 257/E27.016; 361/56

(58) Field of Classification Search
USPC .......... 438/171, 190; 257/358, E27.006, 533, 257/E27.023; 327/545, 546; 361/56, 11, 361/207, 534
See application file for complete search history.

(56) References Cited

U.S. PATENT DOCUMENTS

| | | | | |
|---|---|---|---|---|
| 4,800,303 A | * | 1/1989 | Graham et al. | 326/72 |
| 5,990,731 A | * | 11/1999 | Yoshida | 327/545 |
| 7,817,385 B2 | * | 10/2010 | Kawachi | 361/56 |
| 7,915,678 B1 | * | 3/2011 | Vashchenko | 257/341 |
| 8,045,626 B2 | * | 10/2011 | Iwasaki | 375/257 |
| 8,339,756 B2 | * | 12/2012 | Maloney et al. | 361/56 |
| 2006/0086983 A1 | | 4/2006 | Nawate | |
| 2008/0068074 A1 | * | 3/2008 | Delano | 330/10 |
| 2012/0176710 A1 | * | 7/2012 | Domanski et al. | 361/56 |

FOREIGN PATENT DOCUMENTS

| | | |
|---|---|---|
| JP | 5-90481 | 4/1993 |
| JP | 6-177328 | 6/1994 |
| JP | 2006-128293 | 5/2006 |

* cited by examiner

*Primary Examiner* — Jarrett Stark
*Assistant Examiner* — Shahed Ahmed
(74) *Attorney, Agent, or Firm* — Polansky & Associates, P.L.L.C.; Paul J Polansky

(57) ABSTRACT

The invention provides a semiconductor device including an ESD protection circuit with a high ESD protection characteristic. An RC timer included discharge portion including an RC timer formed by a resistor element and a capacitor element and a PLDMOS transistor is formed so as to turn on only when a surge voltage due to static electricity is applied. Furthermore, a noise prevention portion including first and second NMOS off transistors of which the source electrode and the drain electrode are connected is formed. The source electrode of the PLDMOS transistor of the RC timer included discharge portion is connected to a power supply line. The drain electrode of the PLDMOS transistor and the drain electrode of the first NMOS off transistor are connected. The source electrode of the second NMOS off transistor is connected to a ground line.

8 Claims, 4 Drawing Sheets

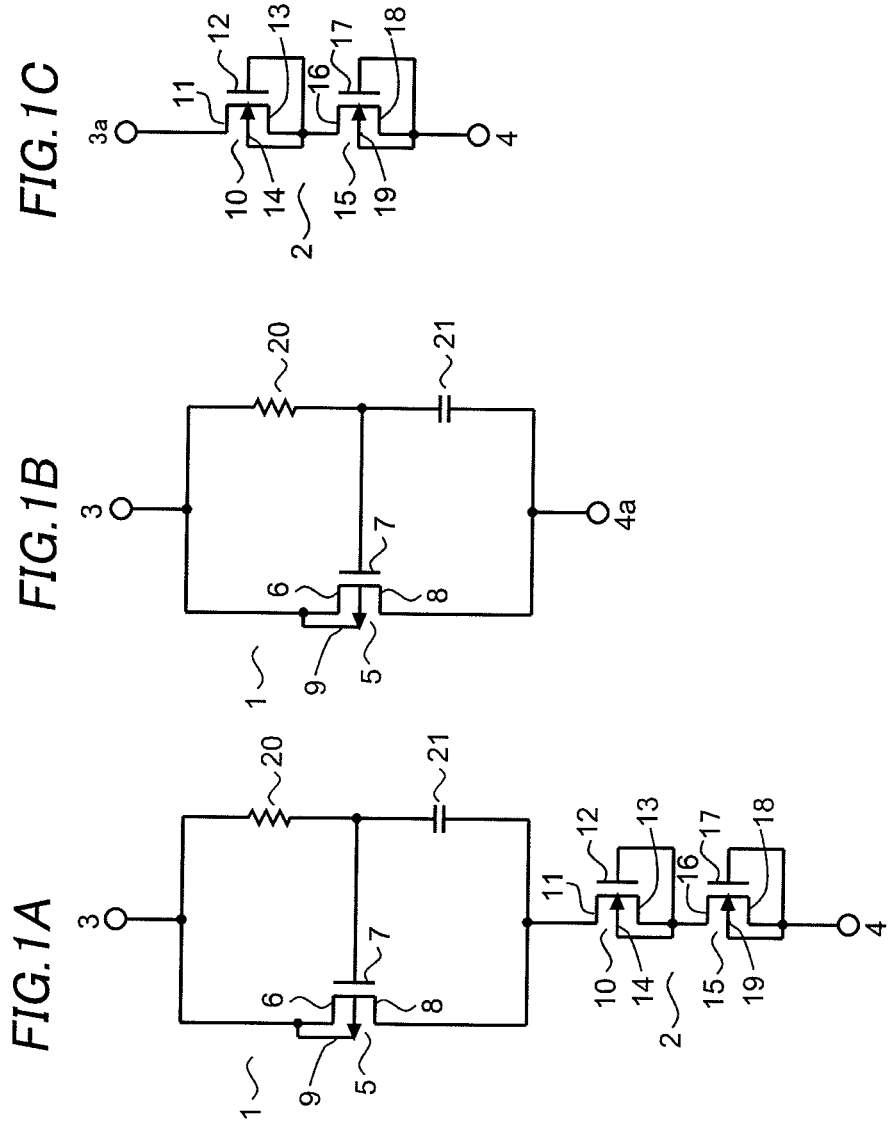

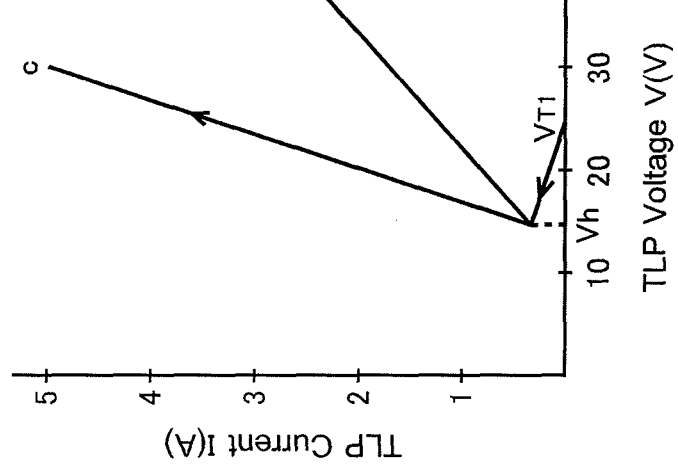
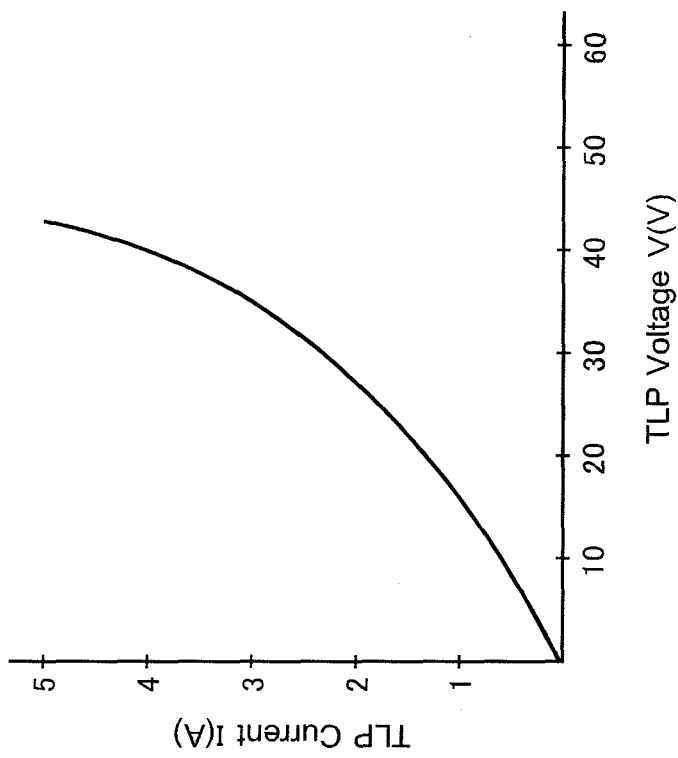
FIG.2A
FIG.2B

SEMICONDUCTOR DEVICE

CROSS-REFERENCE OF THE INVENTION

This application claims priority from Japanese Patent Application No. 2011-005635, the content of which is incorporated herein by reference in its entirety.

BACKGROUND OF THE INVENTION

1. Field of the Invention

The invention relates to a semiconductor device, in particular, an ESD protection circuit having a high ESD protection characteristic.

2. Description of the Related Art

Conventionally, for addressing ESD, various types of semiconductor devices including ESD protection circuits have been proposed. Typically, as shown in FIG. 4A, an internal circuit 56 is protected by connecting a PN junction diode 53 between an input output terminal 50 and a power supply line 51, connecting a PN junction diode 54 between the input output terminal 50 and a ground line 52, and connecting a PN junction diode 55 between the power supply line 51 and the ground line 52. It is noted that the ESD means the discharge of static electricity and is an abbreviation of Electro-Static Discharge.

For example, even when a large surge voltage is applied to the power supply line 51, the high breakdown voltage PN junction diode 55 is used to discharge an ESD current to the ground line 52 by the avalanche breakdown of the PN junction diode 55. Since an unnecessary current does not flow until the avalanche breakdown occurs, the tolerance to power supply noise is also high.

FIG. 4B shows a relation between a surge voltage and an ESD current by TLP current I and TLP voltage V. It is noted that the TLP is an abbreviation of a Transmission Line Pulse. The TLP will be described below. In a case of a high breakdown voltage diode, the resistance to an ESD current after avalanche breakdown is high, and the ESD current increases, forming a gentle gradient as shown by a line a in FIG. 4B. Therefore, voltages at both the ends of this resistor are large, and it is difficult to protect the internal circuit completely.

In detail, when a large surge voltage is applied to the power supply line 51, the PN junction diode 55 breaks down in an avalanche state, and an ESD current flows from the power supply line 51 toward the ground line 52. At this time, the diode 55 that breaks down in an avalanche state becomes a large resistor for the ESD current, and generates a high voltage between the power supply line 51 and the ground line 52.

A high voltage generated between the power supply line 51 and the ground line 52 is directly applied to the internal circuit. This results in avalanche breakdown or the like of devices forming the internal circuit, causing difficulty in safety design against ESD. Furthermore, since this high voltage is applied between the power supply line 51 and the ground line 52, a leakage current flows by a parasitic transistor or the like.

This is solved by increasing the area of the diode so as to decrease the resistance. As a result, a current easily flows as shown by a line b in FIG. 4B, and an ESD current is quickly discharged to the ground line 52.

However, as the miniaturization of elements is enhanced for a demand for higher speed and smaller size or the like, the electrostatic breakdown tolerance of a semiconductor device is decreased and thus a more proper ESD protection element is essential. Japanese Patent Application publication No. 2006-128293 discloses a BiCMOS type integrated circuit including a MOS type transistor as a high breakdown voltage element and an NPN bipolar transistor as a low breakdown voltage element, in which the low breakdown voltage NPN transistor is used as an ESD protection element.

Furthermore, Japanese Patent Application publication No. Hei 05-90481 discloses using an NPN bipolar transistor provided between a power supply line and a ground line as an ESD protection element, in which the base and the emitter are connected by a resistor, instead of using a PN junction diode. Japanese Patent Application publication No. Hei 06-177328 discloses decreasing a trigger voltage for the snapback characteristic of a MOS type transistor used as an ESD protection element so as to enhance the ESD protection characteristic.

The snapback characteristic means a response of a device to an ESD pulse or the like, and includes a response of a parasitic element. For example, when a high breakdown voltage PN junction diode is used as a protection element between a power supply line and a ground line, a voltage to start the ESD protection is called a trigger voltage. When a necessary ESD current flows, if a voltage occurring between both the terminals of the PN junction diode is lower than a voltage that breaks the internal circuit, the internal circuit is protected from ESD. These relevant techniques are disclosed in Japanese Patent Application publication No. 2006-128293, No. Hei 05-90481 and No. Hei 06-177328.

As described above, with the progression of miniaturization, various ESD protection circuits that protect the internal circuits from ESD have been developed. In Japanese Patent Application publication No. 2006-128293, No. Hei 05-90481 and No. Hei 06-177328 described above, the types and structures of protection elements forming an ESD protection circuit are improved so as to enhance the ESD protection characteristic. However, it is also important to enhance the ESD protection characteristic by forming an ESD protection circuit with such protection elements and devising a circuit structure as well as by developing protection elements in themselves.

SUMMARY OF THE INVENTION

The invention provides a semiconductor device including a static electricity discharge protection circuit. The static electricity discharge protection circuit includes an RC timer in which a resistor element and a capacitor element are connected in series; a PMOS transistor including a gate electrode connected to a connection point of the resistor element and the capacitor element of the RC timer, a source electrode connected to a terminal of the resistor element which is different from a terminal of the resistor element connected to the capacitor element, and a drain electrode connected to a terminal of the capacitor element which is different from a terminal of the capacitor element connected to the resistor element; and an NMOS off transistor including a drain electrode connected to the drain electrode of the PMOS transistor, a source electrode, and a gate electrode connected to the source electrode of the NMOS off transistor.

The invention also provides a semiconductor device including a static electricity discharge protection circuit. The static electricity discharge protection circuit includes an RC timer in which a resistor element and a capacitor element are connected in series; a PMOS transistor including a gate electrode connected to a connection point of the resistor element and the capacitor element of the RC timer, a source electrode connected to a terminal of the resistor element which is different from a terminal of the resistor element connected to the capacitor element, and a drain electrode connected to a terminal of the capacitor element which is different from a terminal of the capacitor element connected to the resistor element; and a PMOS off transistor including a source electrode connected to the drain electrode of the PMOS transistor, a gate electrode connected to the source electrode of the PMOS off transistor, and a drain electrode.

The invention also provides a semiconductor device including a static electricity discharge protection circuit. The static electricity discharge protection circuit includes: an RC timer in which a resistor element and a capacitor element are connected in series; an NMOS transistor including a gate electrode connected to a connection point of the resistor element and the capacitor element of the RC timer, a source electrode connected to a terminal of the resistor element which is different from a terminal of the resistor element connected to the capacitor element, and a drain electrode connected to a terminal of the capacitor element which is different from a terminal of the capacitor element connected to the resistor element; and an NMOS off transistor including a source electrode connected to the drain electrode of the NMOS transistor, a gate electrode connected to the source electrode of the NMOS off transistor, and a drain electrode.

The invention also provides a semiconductor device including a static electricity discharge protection circuit. The static electricity discharge protection circuit includes an RC timer in which a resistor element and a capacitor element are connected in series; an NMOS transistor including a gate electrode connected to a connection point of the resistor element and the capacitor element of the RC timer, a source electrode connected to a terminal of the resistor element which is different from a terminal of the resistor element connected to the capacitor element, and a drain electrode connected to a terminal of the capacitor element which is different from a terminal of the capacitor element connected to the resistor element; and a PMOS off transistor including a drain electrode connected to the drain electrode of the NMOS transistor, a source electrode, and a gate electrode connected to the source electrode of the PMOS off transistor.

BRIEF DESCRIPTION OF THE DRAWINGS

FIGS. 1A, 1B and 1C are diagrams showing an ESD protection circuit of the first embodiment of the invention.

FIGS. 2A and 2B are graphs showing a relation between a TLP current I and a TLP voltage V of an ESD protection circuit of first and second embodiments of the invention.

DETAILED DESCRIPTION OF THE INVENTION

Figure 3:
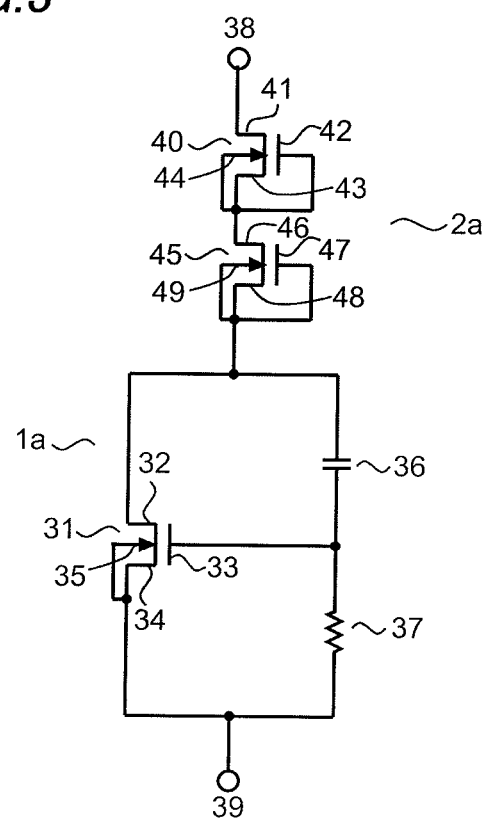
FIG. 3 is a diagram showing the ESD protection circuit of the second embodiment of the invention.
Figure 4A:
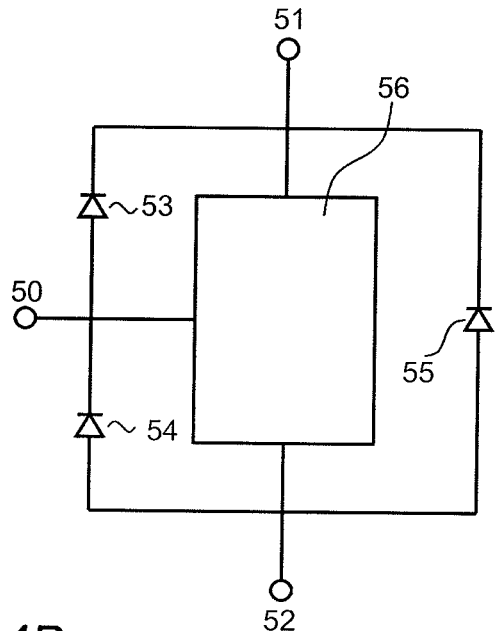
FIGS. 4A and 4B are a diagram showing a conventional ESD protection circuit and a graph showing a relation between a TLP current I and a TLP voltage V of the circuit.
Figure 4B:
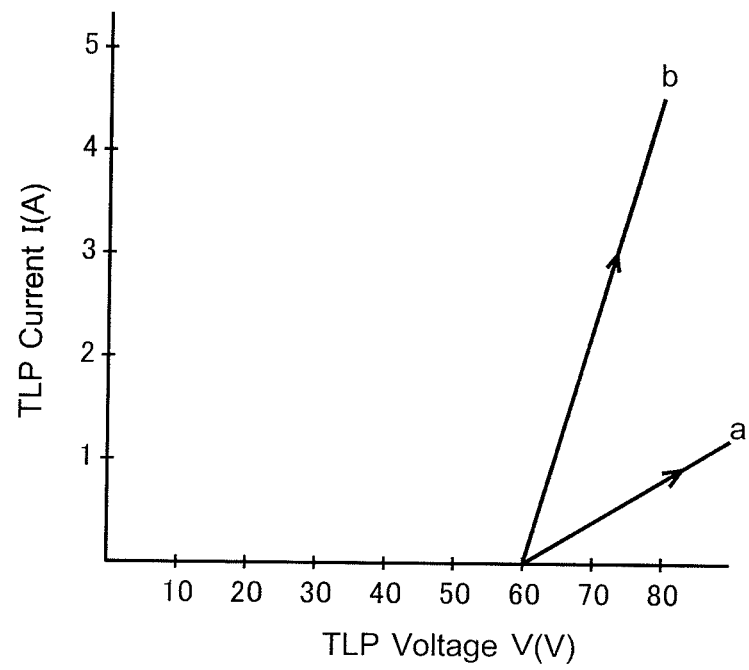

An ESD protection circuit and its operation of a first embodiment will be described hereafter referring to FIGS. 1A, 1B, 1C, 2A and 2B. FIG. 1A shows the ESD protection circuit of the first embodiment. As shown in FIG. 1A, the ESD protection circuit includes an RC timer included discharge portion 1 including a PLDMOS transistor 5, which is separately shown in FIG. 1B as a PMOS transistor, and a noise prevention portion 2 including NMOS off transistors 10 and 15, which is separately shown in FIG. 1C.

In the first embodiment, the ESD protection circuit is formed by combining the RC timer included discharge portion 1 and the noise prevention portion 2. It is noted that the LDMOS is an abbreviation of a Lateral Double Diffused Metal Oxide Semiconductor and means a lateral type double-diffused gate MOS, and the MOS off transistor means a MOS transistor in which the source electrode and the gate electrode are connected. An internal circuit (not shown) that is protected from ESD is connected between a power supply line 3 and a ground line 4 in parallel with the ESD protection circuit.

The ESD protection circuit is formed by connecting the RC timer included discharge portion 1 and the noise prevention portion 2 in series. A terminal of the RC timer included discharge portion 1 that is on the opposite side from a terminal connected to the noise prevention portion 2 is connected to the power supply line 3, and a terminal of the noise prevention portion 2 that is on the opposite side from a terminal connected to the RC timer included discharge portion 1 is connected to the ground line 4. This structure forms a discharge path of an ESD current from the power supply line 3 toward the ground line 4.

In detail, in the ESD protection circuit of the first embodiment, when a large surge voltage or current is applied to the power supply line 3, an ESD current flows through the on-state PLDMOS transistor 5 of the RC timer included discharge portion 1 and the two NMOS off transistors 10 and 15 of the noise prevention portion 2 which are in a snapback state after avalanche breakdown, and flows into the ground line 4. Hereafter, the operation of the ESD protection circuit shown in FIG. 1A will be described by describing the operation of the RC timer included discharge portion 1 and the operation of the noise prevention portion 2 respectively.

As shown in FIG. 1B, the RC timer included discharge portion 1 includes the high breakdown voltage PLDMOS transistor 5, a resistor element 20 and a capacitor element 21. The resistor element 20 and the capacitor element 21 are connected in series, forming an RC timer including a resistor R and a capacitor C. The connection point of the resistor element 20 and the capacitor element 21 is connected to the gate electrode 7 of the PLDMOS transistor 5.

Furthermore, the source electrode 6 of the PLDMOS transistor 5, a back gate layer 9 connected to the source electrode 6, and a terminal of the resistor element 20 that is on the opposite side from a terminal connected to the capacitor element 21 are connected to the power supply line 3. The drain electrode 8 of the PLDMOS transistor 5 and a terminal of the capacitor element 21 that is on the opposite side from a terminal connected to the resistor element 20 are connected to a ground line 4a corresponding to a ground potential.

FIG. 2A shows a relation between a TLP current I when a large TLP current I flows in the RC timer included discharge portion 1 in FIG. 1B and a TLP voltage V occurring at the terminal on the power supply line 3 side. By a TLP evaluation method, the voltage-current characteristic of the PLDMOS transistor 5 of the RC timer included discharge portion 1 is evaluated using the pulse.

FIG. 2A is a plot of the TLP voltage V corresponding to the gradually increased TLP current I applied to the RC timer included discharge portion 1, the TLP current I including a narrow pulse with a pulse width of about 100 nsec. The axis of ordinates corresponds to the TLP current I, and the axis of abscissas corresponds to the TLP voltage V.

When the TLP current I as a surge voltage $V_P$ or a surge current $I_P$ is applied to the power supply terminal 3, a current i flowing through the RC timer including the resistor R and the capacitor C is $i=dq/dt$ where an electric charge accumulated in the capacitor element 21 is q. Furthermore, a voltage applied to the capacitor element 21 is $q/C=V_P-R(dq/dt)$, and by solving this differential equation, $q=CV_P(1-e^{-t/RC})$ is obtained, thereby $i=dq/dt=(V_P/R)e^{-t/RC}$.

The voltage applied to the capacitor is thus $q/C=V_P(1-e^{-t/RC})$. Therefore, when t is 0 second and therearound when the current i starts flowing, the voltage applied to the capacitor element 21 is q/C=0V. When time passes and t=2RC, q/C=0.86$V_P$. When time further passes and t=3RC, q/C=0.95$V_P$. Thus the voltage applied to the capacitor increases toward $V_P$ with time.

When the TLP current I starts flowing into the power supply terminal 3, the TLP voltage V of the source electrode 6 of the PLDMOS transistor 5 of the RC timer included discharge portion 1 increases. However, the voltage of the gate electrode 7 is equal to the voltage of the capacitor element 20 at the connection point of the resistor element 20 and the capacitor element 21, and increases with time from 0V that is equal to the potential of the ground line 4a as described above.

Therefore, between the gate electrode 7 of the PLDMOS transistor 5 and the N type semiconductor layer as the back gate layer 9 through the gate insulation film, a state where the potential on the gate electrode 7 side is lower than the N type semiconductor layer is formed. This state is equivalent to a case where a negative voltage is applied to the gate electrode 7 when the voltage of the N type semiconductor layer is supposed to be a reference.

As a result, a P type channel layer is formed in the N type semiconductor layer near the interface of the gate insulation film and the N type semiconductor layer immediately under the gate electrode 7, and thus the PLDMOS transistor 5 turns on. This on operation of the PLDMOS transistor 5 makes an ESD current occurring by a surge voltage directly flow into the ground line 4a without through the internal circuit.

Therefore, the RC timer included discharge portion 1 itself in FIG. 1B is usable as an ESD protection element. In this case, the TLP voltage V and the TLP current I in FIG. 2A are in the following relation. In detail, $I=(W\mu C_f/2L)(V-V_T)^2$ is almost established where the gate width of the PLDMOS transistor 5 is W, the gate length of a region between the source region and the drain region is L, the capacitance of the gate insulation film is $C_f$, the carrier mobility is μ, the threshold voltage of the PLDMOS transistor 5 is $V_T$, and the TLP voltage V is V.

As a result, when the TLP voltage V larger than $V_T$ occurs, the TLP current I flows. And even when the TLP voltage V is lower than the maximum operation voltage of the semiconductor device, an ESD current flows through the PLDMOS transistor 5 of the RC timer included discharge portion 1. In this operation, the PLDMOS transistor 5 may be turned on for an instant, depending on the characteristics of the power supply noise.

Therefore, when the RC timer included discharge portion 1 is used as an ESD protection element by itself, this causes noise in the semiconductor device. Furthermore, when the semiconductor device is a high efficiency power supply integrated circuit or the like, the power supply efficiency is decreased.

Next, an operation when the TLP current I flows into the noise prevention portion 2 in FIG. 1C will be described hereafter referring to FIG. 2B. The noise prevention portion 2 includes the NMOS off transistor 10 including a drain electrode 11 connected to a power supply line 3a having a potential corresponding to the power supply potential, a source electrode 13, and a gate electrode 12 and a back gate layer 14 respectively connected to the source electrode 13, and the NMOS off transistor 15 connected to the NMOS off transistor 10 in series.

In the NMOS off transistor 15, the drain electrode 16 is connected to the source electrode 13 of the NMOS off transistor 10, and the gate electrode 17, the back gate layer 19 and the source electrode 18 are connected to the ground line 4. The NMOS off transistors 10 and 15 have the same characteristics, and both are low breakdown voltage devices having the drain-source breakdown voltages $BV_{DS}$ of about 7V in the first embodiment.

In the first embodiment, the NMOS off transistors 10 and 15 have the same characteristics, but not necessarily. Furthermore, instead of these, a combination of a low breakdown voltage NMOS off transistor and a low breakdown voltage PMOS off transistor, an NPN bipolar transistor, or a Zener diode may be used.

A line c in FIG. 2B shows a relation between the TLP current I of the noise prevention portion 2 in FIG. 1C and the TLP voltage V occurring at the terminal on the power supply line 3a side. When the TLP voltage V becomes a TLP voltage value (not shown) that is the sum of the drain-source breakdown voltages $BV_{DS}$ of the NMOS off transistors 10 and 15 or more, the NMOS off transistors 10 and 15 turn to an avalanche breakdown state, and the TLP current I (not shown) starts flowing toward the ground line 4.

The TLP voltage V further increases and reaches a trigger voltage $V_{T1}$ for a snapback characteristic as shown in FIG. 2B. Since each of the trigger voltages of the NMOS off transistors 10 and 15 is about 12 V, the trigger voltage $V_{T1}$ of the noise prevention portion 2 in the first embodiment is about 24 V that is the sum of these.

As the TLP current I further increases, the TLP voltage V shows a negative resistance, leading in the negative direction, and a so-called snapback phenomenon occurs. This occurs by turning on of the parasitic NPN bipolar transistors respectively using the N+ type source layers connected to the source electrodes 13 and 18 as emitters, the P type back gate layers 14 and 19 as bases, the N+ type drain layers connected to the drain electrodes 11 and 16 as collectors, since excessive holes generated by the avalanche breakdown phenomenon increase the potentials of the back gate layers 14 and 19.

The TLP voltage V that decreases with the increase of the TLP current decreases to a hold voltage $V_h$. As the TLP current I further increases, as shown by the line c in FIG. 2B, the TLP voltage V increases with a gradient that depends on the resistance that depends on the characteristics of the parasitic NPN bipolar transistors. The hold voltage $V_h$ is about the sum of the emitter-collector breakdown voltages of the parasitic NPN bipolar transistors.

Since the NMOS off transistors 10 and 15 are low breakdown voltage devices, the resistance values to a current are small and the current-voltage characteristic of the noise prevention portion 2 shown by the line c in FIG. 2B forms a highly steep gradient. Therefore, when a large surge voltage is applied to the power supply terminal 3a of the noise prevention portion 2, an ESD current is quickly discharged to the ground line 4 without an influence on the internal circuit.

In detail, the noise prevention portion 2 itself including the low breakdown voltage MOS off transistors 10 and 15 connected in series in FIG. 1C forms a favorable ESD protection circuit with small area, compared with the high breakdown voltage PLDMOS transistor 5.

However, in order to avoid the avalanche breakdown of the noise prevention portion 2 when a peak supply voltage 50 V is applied, when the drain-source breakdown voltage of each of the NMOS off transistor 10 and so on is 7 V, at least 8 pieces of low breakdown voltage MOS off transistors need be connected in series. In this case, the trigger voltages $V_{T1}$ of the 8 pieces of NMOS off transistors are $V_{T1}$=12V×8=96V in total since each is 12 V, and this is a high value.

As a result, although the avalanche breakdown does not occur in the noise prevention portion 2 when the peak supply voltage 50 V is applied, the snapback characteristic is not effected for a surge voltage between 50 V and about 96 V.

Therefore, if an ESD protection circuit is formed by the noise prevention portion 2 only, a discharge path of an ESD current toward the ground line 4 is not formed, leading to the breakdown of the internal circuit.

Hereafter, the ESD protection circuit of the first embodiment including the RC timer included discharge portion 1 and the noise prevention portion 2 described above will be described referring to FIGS. 1A and 2B. As shown in FIG. 1A, in the first embodiment, the RC timer included discharge portion 1 and the noise prevention portion 2 that have the features described above are connected in series, and disposed between the power supply line 3 and the ground line 4. Therefore, an ESD current does not flow from the power supply line 3 to the ground line 4 until both the RC timer included discharge portion 1 and the noise prevention portion 2 turn to the electrically conductive state.

When a predetermined surge voltage is applied to the power supply line 3, the PLDMOS transistor 5 of the RC timer included discharge portion 1 turns to the on state as described above. However, since the noise prevention portion 2 is connected to the RC timer included discharge portion 1 in series, a discharge path of an ESD current from the power supply line 3 to the ground line 4 is not formed until the amount of the surge voltage exceeds 14 V that is the sum of the breakdown voltages of the NMOS off transistor 10 and the NMOS off transistor 15 that are each 7 V and further exceeds 24 V that is the sum of the trigger voltages of these.

On the other hand, the maximum operation voltage of the internal circuit in the first embodiment is 14 V. Therefore, in the first embodiment in which an ESD current does not flow from the power supply line 3 to the ground line 4 until a surge voltage exceeds 24 V, there does not occur a problem in tolerance to power supply noise in the operation state or does not occur a problem of decrease in power supply efficiency in a power supply integrated circuit or the like, the problems occurring in an ESD protection circuit including the RC timer included discharge portion 1 shown in FIG. 1B only. This is the most feature of the first embodiment.

When a large surge voltage is applied to the power supply line 3, a P type channel layer is formed in the PLDMOS transistor 5 forming the RC timer included discharge portion 1 of the ESD protection circuit in FIG. 1A, and a surge current (TLP current) on the axis of ordinates corresponding to a surge voltage (TLP voltage) on the axis of abscissas in FIG. 2A flows. The resistance r of the channel layer becomes the reciprocal of the gradient in the graph of FIG. 2A, and r=(L/Wμ$C_I$/(V-$V_T$) is established from I=(Wμ$C_I$/2L) (V-$V_T$)² described above. The larger the surge voltage V is, the smaller the resistance r is.

Furthermore, at this time, in the noise prevention portion 2 in FIG. 1A, like in the ESD protection circuit having the noise prevention portion 2 only shown in FIG. 1C described above, the snapback starts when the surge voltage becomes 24 V or more, and after it reaches the hold voltage $V_h$ the ESD current increases and flows. However, as shown by a line a in FIG. 2B, the current gradient is more gentle than in the case having the noise prevention portion 2 only, since the resistance of the channel layer of the PLDMOS transistor 5 is added.

Next, a case where a negative surge voltage is applied to the power supply line 3 will be briefly described hereafter. The negative surge voltage is also directly applied to the back gate layer 9 made of the N type semiconductor layer connected to the source electrode 6 of the PLDMOS transistor 5, thereby forward-biasing the PN junction of the N type semiconductor layer and the P+ type drain layer connected to the drain electrode 8.

Furthermore, the negative surge voltage is applied to the drain electrode 11 in the NMOS off transistor 10 of the noise prevention portion 2, thereby forward-biasing the PN junction of the N+ type drain layer connected to the drain electrode 11 and the P type semiconductor layer as the back gate layer 14 connected to the source electrode 13. In the NMOS off transistor 15, too, the PN junction formed similarly is forward-biased.

Therefore, even in the case where a negative surge voltage is applied to the ESD protection circuit in the first embodiment, an ESD current is quickly discharged to the power supply line 3 through the forward-biased PN junction formed in the PLDMOS transistor 5 forming the RC timer included discharge portion 1 and the forward-biased PN junction formed in each of the NMOS off transistors 10 and 15 forming the noise prevention portion 2 as a discharge path, and thus the internal circuit is protected.

The feature of the ESD protection circuit of the first embodiment is as follows. In detail, the feature is the structure of the series connection of the RC timer included discharge portion 1 formed by the high breakdown voltage PLDMOS transistor 5 and the RC timer including the resistor element 20 and the capacitor element 21 and the noise prevention portion 2 including the two NMOS off transistors 10 and 15 connected in series, and has the following effect.

In the first embodiment, the breakdown voltage of the PLDMOS transistor 5 is 42 V, and the total breakdown voltage of the two NMOS off transistors 10 and 15 is 14 V. Therefore, the ESD protection circuit clears a test with a peak supply voltage 50 V. Furthermore, an operation start voltage (trigger voltage $V_{T1}$) to start flowing an ESD current in the ESD protection circuit is 24 V by the two NMOS off transistors in the first embodiment.

Therefore, the voltage to start flowing an ESD current is largely lower than a voltage necessary for a conventional high breakdown voltage diode 55, i.e. 50 V or more even when added with a threshold voltage applied to the PLDMOS transistor 5. Furthermore, since the hold voltage $V_h$ is set to the maximum operation voltage (14V in the first embodiment) of the internal circuit or more, tolerance to power supply noise is secured enough. Furthermore, the power supply efficiency of a power supply integrated circuit or the like does not decrease.

Even when a negative surge voltage is applied to the power supply line 3, as described above, the forward-biased PN junctions formed in the PLDMOS transistor 5 and the NMOS off transistors 10 and 15 respectively are used as a discharge path, and an ESD current is quickly discharged to the power supply line 3. Although the number of the NMOS off transistor 10 and so on are two in the first embodiment, it may be increased or decreased depending on the maximum operation voltage.

Furthermore, a PMOS off transistor may be used instead of the NMOS off transistor 10 and so on. In this case, the drain electrode 8 of the PLDMOS transistor 5 and the source electrode, the gate electrode and the back gate layer of the PMOS off transistor are connected. The drain electrode of the PMOS off transistor is connected to the ground line 4.

In a case of using a plurality of PMOS off transistors, the drain electrode of a first PMOS off transistor, and the source electrode, the gate electrode and the back gate layer of a second PMOS off transistor are connected. The drain electrode of the second PMOS off transistor is connected to the ground line.

However, in a case of a PMOS off transistor, the hold voltage $V_h$ is higher since the snapback characteristic is different from that of an NMOS off transistor. Therefore, it is preferable to form the noise prevention portion 2 by an NMOS off transistor. As described above, the noise prevention portion 2 may be realized by a combination of an NPN bipolar transistor, a Zener diode or the like. Furthermore, compared with the case of the conventional high breakdown voltage diode 55, resistance to an ESD current is smaller, thereby hardly leading to faulty operation due to the on operation of a parasitic transistor or the like.

A method of manufacturing an ESD protection circuit of the first embodiment will be described briefly without a drawing since the ESD protection circuit is manufactured at the same time as when the internal circuit is manufactured. An N+ type embedded layer, an N− type epitaxial layer, a P+ type isolation layer are formed using a P− type semiconductor substrate by a BiCMOS process. The NMOS off transistor 10 is formed by forming a P− type well layer in an N− type epitaxial layer by an ordinary method and forming an N+ type source layer, an N+ type drain layer and a P+ type contact layer in the P− type well layer. It is noted that the BiCMOS includes a DMOS (Double Diffused MOS) structure.

Furthermore, a gate insulation film and a polysilicon gate electrode are formed, and a drain electrode 11, a source electrode 13 and a gate electrode 12 made of aluminum or the like are formed through contact holes formed in an interlayer insulation film on the semiconductor substrate. The gate electrode 12 and the source electrode 13 are connected through aluminum or the like, thereby forming the NMOS off transistor 10. In the case of the plurality of NMOS off transistors 10 and 15, the source electrode 13 and the drain electrode 16 of the transistors are connected through wires of aluminum or the like.

Furthermore, the capacitor element 21 is formed by forming an N+ type layer in the N− type epitaxial layer by a predetermined method and forming a polysilicon layer on an insulation film formed on the front surface thereof, and thus the N+ type layer is used as one electrode and the polysilicon layer is used as the other electrode. The resistor element 20 is formed by a polysilicon layer on an insulation film formed on the P− type semiconductor substrate, and connected to the capacitor element through a wire of aluminum or the like.

As to the PLDMOS transistor 5, an N− type well layer is formed in the N− type epitaxial layer, and a P+ type source layer and an N+ type contact layer are formed in the N− type well layer. Furthermore, a P− type well layer is formed in the N− type epitaxial layer adjacent to the N− type well layer, and a P+ type drain layer is formed in the P− type well layer. Then the gate electrode 7, the resistor element 20 and the capacitor element 21 are connected through a wire made of aluminum or the like. Furthermore, the drain electrode 8 is connected to the drain electrode 11 of the NMOS off transistor 10 through a wire made of aluminum or the like.

At the same time, the source electrode 6 of the PLDMOS transistor 5 and the terminal of the resistor element 20 that is on the opposite side from the terminal connected to the capacitor element 21 are connected to the power supply line 3, and the source electrode 18 of the NMOS off transistor 15 is connected to the ground line 4. Finally, these are covered by a passivation film made of a silicon nitride film or the like, thereby completing a semiconductor device including the ESD protection circuit of the first embodiment. Relevant manufacturing techniques are disclosed in Japanese Patent Application publication No. Hei 09-129911, No. 2000-243979, No. 2006-020521 and No. 2007-287798.

A second embodiment will be described hereafter referring to FIG. 3. A first different point from the first embodiment is that the transistor forming the RC timer included discharge portion 1a is formed as an NLDMOS transistor 31 instead of the PLDMOS transistor 5 and an open terminal of a resistor element 37 forming the RC timer is connected to the source electrode 34 of the NLDMOS transistor 31 and an open terminal of the capacitor element 36 is connected to the drain electrode 32 of the NLDMOS transistor 31.

A second different point is that the source electrode 34 of the NLDMOS transistor 31 of the RC timer included discharge portion 1a is connected to a ground line 39, and the drain electrode 32 is connected to the source electrode 48 of an NMOS off transistor 45 of a noise prevention portion 2a, and the drain electrode 41 of an NMOS off transistor 40 of the noise prevention portion 2a is connected to a power supply line 38.

As to the second different point, when the internal circuit is in normal operation, this structure keeps the potential of the gate electrode 33 of the NLDMOS transistor 31 at a ground potential securely and keeps the off state of the NLDMOS transistor 31. If the noise prevention portion 2a is connected to the ground line 39 like in the first embodiment, the potential of the gate electrode 33 of the NLDMOS transistor 31 is not decided by the resister element 37 only.

When a positive large surge voltage is applied to the power supply line 38, the noise prevention portion 2a of the second embodiment operates in the similar manner to the first embodiment and forms a flow path of an ESD current corresponding to the TLP current shown in FIG. 2B. On the other hand, immediately after a similar surge voltage is applied to the RC timer included discharge portion 1a, a surge voltage is not applied to the capacitor element 36 and all the surge voltage is applied to the resistor element 37 like in the first embodiment described above.

Therefore, the potential of the gate electrode 33 of the NLDMOS transistor 31 of the RC timer included discharge portion 1a increases by the amount of increase of the potential of the resistor element 37. As a result, an N type inverting layer is formed in the interface portion between the P type semiconductor layer corresponding to the back gate layer 35 of the NLDMOS transistor 31 and the gate insulation film, and the NLDMOS transistor 31 turns to the on state. Therefore, a flow path of an ESD current corresponding to the TLP current shown in FIG. 2A is formed.

In detail, for a positive surge voltage applied to the power supply line 38, a flow path of an ESD current toward the ground line 39 is formed like in the first embodiment so as to protect the internal circuit from an ESD due to a large surge current. When a negative surge voltage is applied, too, an ESD current is quickly discharged to the power supply line 38 by the forward-biased PN junction formed like in the first embodiment.

Although the embodiments are described using the PLDMOS transistor 5 as a PMOS transistor and the NLDMOS transistor 31 as an NMOS transistor as an example, the similar effect is obtainable by using a high breakdown voltage PMOS power transistor instead of the PLDMOS transistor 5 and a high breakdown voltage NMOS power transistor instead of the NLDMOS transistor 31.

The embodiments above realize a semiconductor device that secures a discharge path having low resistance to an ESD current and has an ESD protection circuit having high tolerance to power supply noise.

What is claimed is:

1. A semiconductor device comprising a static electricity discharge protection circuit that protects an integrated circuit, the protection circuit comprising:
   an RC timer comprising a resistor element and a capacitor element which are connected in series;
   a PMOS transistor comprising a gate electrode connected to a connection point of the resistor element and the capacitor element of the RC timer, a source electrode connected to a terminal of the resistor element which is different from a terminal of the resistor element connected to the capacitor element, and a drain electrode connected to a terminal of the capacitor element which is different from a terminal of the capacitor element connected to the resistor element;

a first NMOS off transistor comprising a drain electrode connected to the drain electrode of the PMOS transistor, a source electrode and a gate electrode connected to the source electrode of the first NMOS off transistor, and a second NMOS off transistor comprising a drain electrode connected to the source electrode of the first NMOS off transistor, a source electrode connected to a ground line that always supplies a ground voltage to the protected integrated circuit, and a gate electrode connected to the source electrode of the second NMOS off transistor so that the first and second NMOS off transistors are connected in series between the PMOS transistor and the ground line.

2. The semiconductor device of claim 1, wherein the PMOS transistor comprises a PLDMOS transistor.

3. A semiconductor device comprising a static electricity discharge protection circuit that protects an integrated circuit, the protection circuit comprising:

an RC timer comprising a resistor element and a capacitor element that are connected in series;

a PMOS transistor comprising a gate electrode connected to a connection point of the resistor element and the capacitor element of the RC timer, a source electrode connected to a terminal of the resistor element which is different from a terminal of the resistor element connected to the capacitor element, and a drain electrode connected to a terminal of the capacitor element which is different from a terminal of the capacitor element connected to the resistor element a first PMOS off transistor comprising a source electrode connected to the drain electrode of the PMOS transistor, a gate electrode connected to the source electrode of the PMOS off transistor and a drain electrode, and a second PMOS off transistor comprising a source electrode connected to the drain electrode of the first PMOS off transistor, a gate electrode connected to the source electrode of the second PMOS off transistor and a drain electrode connected to a ground line that always supplies a ground voltage to the protected integrated circuit, so that the first and second PMOS off transistors are connected in series between the PMOS transistor and the ground line.

4. The semiconductor device of claim 3, wherein the PMOS transistor comprises a PLDMOS transistor.

5. A semiconductor device comprising a static electricity discharge protection circuit that protects an integrated circuit, the protection circuit comprising:

an RC timer comprising a resistor element and a capacitor element that are connected in series;

an NMOS transistor comprising a gate electrode connected to a connection point of the resistor element and the capacitor element of the RC timer, a source electrode connected to a terminal of the resistor element which is different from a terminal of the resistor element connected to the capacitor element, and a drain electrode connected to a terminal of the capacitor element which is different from a terminal of the capacitor element connected to the resistor element;

a first NMOS off transistor comprising a source electrode connected to the drain electrode of the NMOS transistor, a gate electrode connected to the source electrode of the first NMOS off transistor, and a drain electrode, and a second NMOS off transistor comprising a source electrode connected to the drain electrode of the first NMOS off transistor, a gate electrode connected to the source electrode of the first NMOS off transistor, and a drain electrode connected to a power supply line that always supplies a power voltage to the protected integrated circuit, so that first and second NMOS off transistors are connected in series between the NMOS transistor and the power supply line.

6. The semiconductor device of claim 5, wherein the NMOS transistor comprises an NLDMOS transistor.

7. A semiconductor device comprising a static electricity discharge protection circuit that protects an integrated circuit, the protection circuit comprising:

an RC timer comprising a resistor element and a capacitor element that are connected in series;

an NMOS transistor comprising a gate electrode connected to a connection point of the resistor element and the capacitor element of the RC timer, a source electrode connected to a terminal of the resistor element which is different from a terminal of the resistor element connected to the capacitor element, and a drain electrode connected to a terminal of the capacitor element which is different from a terminal of the capacitor element connected to the resistor element;

a first PMOS off transistor comprising a drain electrode connected to the drain electrode of the NMOS transistor, a source electrode, and a gate electrode connected to the source electrode of the first PMOS off transistor, and a second PMOS off transistor comprising a drain electrode connected to the source electrode of the first PMOS transistor, a source electrode connected to a power supply line that always supplies a power voltage to the protected integrated circuit, and a gate electrode connected to the source electrode of the second PMOS off transistor so that first and second PMOS transistors are connected in series between the NMOS transistor and the power line.

8. The semiconductor device of claim 7, wherein the NMOS transistor comprises an NLDMOS transistor.

* * * * *